United States Patent [19]
Meier

[11] Patent Number: 5,641,362
[45] Date of Patent: Jun. 24, 1997

[54] STRUCTURE AND FABRICATION PROCESS FOR AN ALUMINUM ALLOY JUNCTION SELF-ALIGNED BACK CONTACT SILICON SOLAR CELL

[75] Inventor: Daniel L. Meier, Pittsburgh, Pa.

[73] Assignee: Ebara Solar, Inc., Large, Pa.

[21] Appl. No.: 561,761

[22] Filed: Nov. 22, 1995

[51] Int. Cl.$^6$ .................... H01L 31/06; H01L 31/18
[52] U.S. Cl. .................. 136/256; 136/255; 438/71; 438/72; 438/89; 438/98
[58] Field of Search ..................... 136/255, 256; 437/2, 4–5

[56] References Cited

U.S. PATENT DOCUMENTS

| | | | |
|---|---|---|---|
| 3,112,230 | 11/1963 | Rudenberg | 136/256 |
| 4,133,698 | 1/1979 | Chiang et al. | 136/255 |
| 4,927,770 | 5/1990 | Swanson | 437/2 |

FOREIGN PATENT DOCUMENTS

| | | | |
|---|---|---|---|
| 3-165578 | 7/1991 | Japan | 136/255 |

OTHER PUBLICATIONS

S. Chiang et al, *IEEE Trans. Electron Der.*, vol. ED–25, Dec. 1978, pp. 1405–1409.

*Primary Examiner*—Aaron Weisstuch
*Attorney, Agent, or Firm*—Graham & James LLP

[57] ABSTRACT

An improved solar cell design and method of fabrication that primarily uses two materials, n-type doped silicon and aluminum to form a p-n alloy junction back contact solar cell. The aluminum alloy junctions are placed on the back (unilluminated) side of the cell, thereby combining the desirable features of aluminum (as a dopant, contact metal and light reflector), with the advantages of a back contact cell. The cell design and method of fabrication includes such features as surface texturing, front and back surface field minority carrier mirrors, surface passivation using oxidation layers, use of Al contacts as light reflectors, intrinsic protection against reverse bias due to contiguous $n^+$ and $p^+$ regions, and an improved bus bar contact design suitable for interconnecting cells using a surface mount technology. An improved method of ohmic contact formation uses a self-alignment technique for forming the ohmic contacts.

30 Claims, 5 Drawing Sheets

STRUCTURE AND FABRICATION PROCESS FOR AN ALUMINUM ALLOY JUNCTION SELF-ALIGNED BACK CONTACT SILICON SOLAR CELL

FIELD OF THE INVENTION

The present invention relates to an improved design and method of fabrication for a back contact solar cell.

BACKGROUND OF THE INVENTION

Progress in the development of photovoltaic cells depends on a variety of factors, not least of which are new designs, new materials and new fabrication techniques. Historically, much effort is rightfully placed on attempting to increase the solar conversion efficiency. Progress has been dramatic. For AM1 illumination (sunlight through one thickness of the earth's atmosphere), a selenium solar cell in 1914 had an efficiency of 1%, by 1954 an efficiency of 6% was achieved for a silicon single-crystal cell, whereas by the mid-1980's efficiencies of between 22–25% were reported in solar cells. With concentrator cells, where lenses or mirrors are used to increase sunlight to considerably greater than normal intensity, efficiencies of 27.5% have been reported, which compares favorably with the 38–40% thermal efficiency in a typical fossil fuel power plant and the 32–34% efficiency of a light-water nuclear reactor power plant.

To make a solar cell economical for large-scale applications, however, such as for providing electrical power to residences, other considerations besides high efficiency are prominent. One factor is the fabrication cost of a cell. While most detached homes have enough roof area for solar cells of conventional design to provide 8500 kW-hrs of electricity annually, which is sufficient for the average home, one bottleneck to commercialization is not efficiency but lowering the costs per unit area of a solar cell. A promising candidate for this task is silicon solar cells, especially those cells fabricated from thin (~100 μm) silicon substrates where high-quality silicon is effectively utilized. The challenge at present is to decrease the unit costs for these solar cells so that they may be competitive with traditional fossil fuel power supplies at present energy prices. One way to do this is through improved fabrication techniques.

In addition to fabrication techniques, certain design structures offer advantages over other designs. One such superior design seems to be back contact solar cells, in particular those employing thin silicon substrates.

Homojunction silicon solar cells have a p-n junction for separating photogenerated electrons from photogenerated holes. For the solar cell to function properly, electrons must be directed toward the contact for the n-type material and holes must be directed toward the contact for the p-type material. Light intensity in a semiconductor decreases monotonically with depth, thus the p-n junction is preferably close to the illuminated surface, to reduce recombination of holes and electrons, prior to their being separated by the p-n junction. In thin silicon solar cells, though the thickness of a cell is smaller than in conventional silicon solar cells (~300 μm), and the probability of a photon being converted into an electron-hole or charge-carrier pair is less, the average lifetime of a photogenerated electron-hole pair can be such that the photogenerated electron-pair will survive being swept to their respective contacts. That is to say, in a thin silicon solar cell the minority carrier diffusion length can be relatively large compared to the thickness of the cell so performance of the cell is not unduly compromised. In the present invention the minority carrier diffusion length is equal to the thickness of the cell or greater.

Further, conventional (front-contact) silicon solar cells have a structure in which a large p-n junction is formed over the entire substrate on the illuminated side of the cell. This conventional design has the virtue of simplicity, in that no patterning is required for the emitter (typically the p-type layer in a p-n junction cell) since it covers the entire front surface. However, simultaneous and conflicting requirements are imposed on the front surface and the emitter layer in this type arrangement. On the one hand, the emitter diffusion should be shallow and have a low dopant concentration ($<1\times10^{19}$ cm$^{-3}$) in order to reduce recombination, which occurs with higher dopant concentrations. On the other hand, such a shallow, lightly-doped emitter will have a high sheet resistance (current flows laterally through the top layer of a conventional cell, and in between any contact grid lines, and sheet resistance is inversely proportional to the doped layer thickness), generally greater than 100 ohms/square, which would necessitate that grid contact lines be closely spaced to avoid excessive ohmic power losses.

Closely spaced contact lines in a conventional front-contact cell means reduced power from the cell due to shadowing of the underlying silicon by the contact material. In addition, if the dopant concentration is low, the contact-dopant layer interface will be rectifying (like a Schottky diode) rather than be ohmic, with a corresponding power loss associated with the turn-on voltage of the diode. But the higher the dopant concentration, the greater the recombination of electrons and holes in the emitter layer, which is deleterious and typically occurs greatest near the surface where incoming light shines. Finally, texturing of the front surface to increase light trapping means contact lines have to run over a rough surface without loss of continuity, which can be difficult to achieve. In addition, some texturing methods, such as the porous silicon method, will make creating an emitter diffusion layer of acceptable uniformity more difficult.

For this reason and others, for a conventional cell structure a balance must be sought between the desirability for a heavily-doped surface to promote ohmic contact formation and reduced shadowing and the desirability of a lightly-doped surface for reduced carrier recombination and effective surface passivation. Constraints due to texturing and shadowing are also a problem. An alternative approach is to place the p-n junction on the back (non-illuminated side) of the cell. In such a back-contact solar cell the requirements for texturing and passivating the front surface are separated from the requirements for forming the p-n junction and for contacting the emitter and the base. This means the p-n junction can be deep and the emitter can be heavily doped without extreme consequences. Shadowing of the illuminated surface is no longer an issue since there are no contacts on the front surface, and neither is the spacing of the metal contact lines a problem. Since this type of cell generally employs interdigitated contacts, nearly half the back surface area is covered with positive contact metal and the other half is covered with negative contact metal. Because the p-n junction is on the back of the cell, however, the minority carrier diffusion length in the starting material (base) must exceed the cell thickness in order to obtain satisfactory energy conversion efficiency. The best results for this approach are from a Stanford University group, which has reported efficiencies of 21.3% at one sun (100 mW/cm$^2$) illumination on a float-zone back-contact silicon cell 180 μm thick and 35 cm$^2$ in area; and 22% for one sun AM1 illumination at 24° C. (R. A. Sinton et al., "Large-Area 21% Efficient Si Solar Cells", Conf. Record 23rd IEEE Photovoltaic Specialists Conference, p. 157 (1993); R. A. Sinton et al., IEEE Electron Device Lett., EDL-7, no. 7, p. 567 (1986) both incorporated by reference herein).

A back-contact Si solar cell such as the Sinton et al. design requires relatively complicated and costly fabrication, generally associated with the fabrication of integrated circuits. These processes include separate p-type and n-type diffusions (each requiring masking), alignment of the negative contact metal with respect to the positive contact metal using photolithography, and deposition of a multi-layer contact metal system by evaporation or sputtering, which requires a vacuum system. Thus, although a back-contact structure has significant advantages over a conventional front-contact structure, its implementation can be expensive.

SUMMARY OF THE INVENTION

The present invention reduces the fabrication cost of silicon solar cells while preserving a relatively high solar conversion efficiency by employing a back contact silicon solar cell that uses a single material—preferably aluminum (Al)—as both the p-type dopant material and the ohmic contact material in a bulk layer of n-type silicon (Si). In addition, a novel fabrication for the back contact grid lines is employed that in a preferred embodiment uses a relatively inexpensive screen printed, self-aligned contact system. A novel feature of this contact system is that it is self-aligned by applying anodic oxidation to one set of the contacts to insulate this set from the other set of contacts, thereby eliminating any need for precise alignment of successive mask sets to achieve the grid line pattern.

In a preferred embodiment several other beneficial features are designed into the silicon back contact solar cell of the present invention, including but not limited to: surface texturing (formed both during crystal growth and chemically), front and back surface field minority carrier mirrors, passivation of surfaces using silicon oxide layers, use of antireflective coatings, use of the ohmic contacts as a back surface light reflector, intrinsic protection against damage from a reverse-bias condition due to heavily-doped contiguous $n^+$ and $p^+$ regions, and improved negative and positive contact bus bars that allow a 'surface mount technology' design when connecting cells in series.

DETAILED DESCRIPTION OF THE PREFERRED EMBODIMENTS

Figure 1:
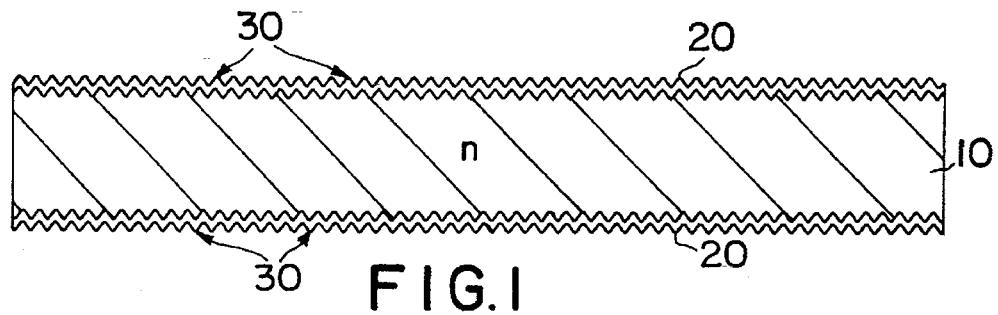
FIG. 1 illustrates a cross-section of a dendritic web silicon blank of the preferred embodiment of the invention.

Turning attention now to the figures, there is disclosed a preferred fabrication technique and design for the present invention.

While FIGS. 1–7 show dendritic web silicon, it is understood that the invention is meant to apply to any form of silicon, including float zone silicon, Czochralski silicon, magnetic Czochralski silicon, cast silicon, and sheet silicon, provided the minority carrier diffusion length under operating cell conditions exceeds the cell thickness.

The starting material for the back contact silicon (Si) solar cell of the present invention is any n-type silicon starting material, shown as layer 10. Common n-type dopants for Si include the atoms from group V of the periodic table, and include such elements as Li, Sb, P, and As. However, it should also be understood that the disclosed cell structure would also function for starting silicon material that is p-type, or even undoped, since layer 10 functions primarily as an absorber of light.

In the preferred embodiment illustrated in the figures, the starting material (for the bulk layer 10 in FIG. 1) is dendritic web silicon doped n-type with antimony (Sb). The dendritic web silicon ribbon is grown using a process similar to that used to produce Czochralski (CZ) silicon. However, silicon grown by other methods may also be used in addition to dendritic web silicon, such as float zone silicon, CZ silicon, cast silicon, and sheet silicon. The Si dendritic web is typically grown at a thickness of 100 microns, though other thicknesses may be used. At this thickness the minority carrier diffusion length is usually more than the thickness of the cell, often two or three times the thickness. On both the top and bottom surfaces of the Sb-doped Si ribbon is placed a shallow $n^+$ layer, 20, diffused into both surfaces while the web is still in the growth furnace. If the $n^+$ surface layers 20 are not introduced during web growth, they can be incorporated at the beginning of the process by any proven method known in the art, including simultaneous front and back diffusion from a liquid dopant source using rapid thermal processing. The $n^+$ layers create a "surface field" that drives holes away from the surfaces and reduces the surface recombination there, as well as accelerating holes generated in the surface layers to the p-n junction, and other beneficial effects that work to increase the short-circuit current and open-circuit voltage to enhance the solar conversion efficiency. Further, the back $n^+$ layer promotes ohmic contact to the negative contact metal there, as described below.

In addition, surface texturing of both top and bottom surfaces is provided in order to trap more incident light. Such surface texturing, shown in the form of a saw-tooth pattern 30, may be grown-in, introduced by anodic etching to create a porous Si layer (as per the method outlined by Y.S. Tsuo et al., "Potential Applications of Porous Silicon in Photovoltaics", Conf. Record 23rd IEEE Photovoltaic Specialists Conf. (Louisville, Ky.) (1993), incorporated by reference herein), or introduced mechanically by sawing or optically such as by laser etching. Though in the preferred embodiment texturing and doped surfaces are shown, their use is optional in the general case. Further, the texturing of the bottom surface of the cell is not shown in FIGS. 2–6 for clarity.

Figure 2:
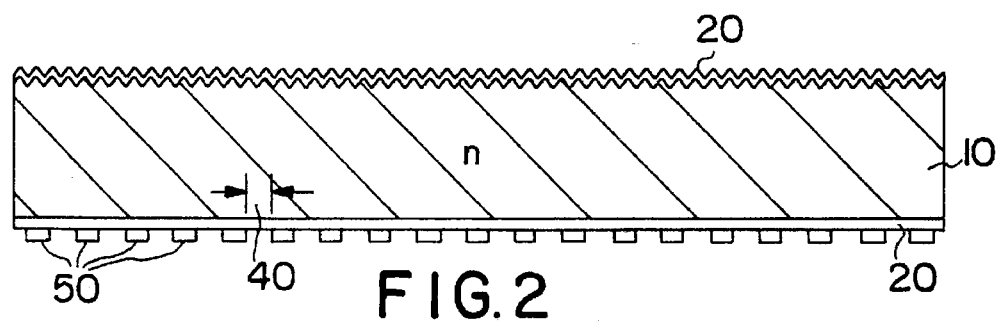
FIG. 2 illustrates the cross-section of the web at the aluminum deposition stage for the positive contact.

FIGS. 1–6 illustrate important steps in the fabrication of the solar cell, including the use of aluminum as both dopant and ohmic contact material as well as its masking using a self-aligning anodic oxidation technique. Aluminum or aluminum material herein is defined as either pure Al or an Al—Si alloy in which the silicon concentration is less than eutectic composition (88.7% Al and 11.3% Si, by weight). This aluminum is deposited over approximately half the total back surface area in stripes spaced edge to edge about 100 μm (microns) apart and each 100 μm wide, as shown in FIG. 2, at spacing 40. The spacing 40 between stripes 50 should be less than a minority carrier (hole) diffusion length for efficient carrier collection. The line width and spacing thus could be reduced to below 100 μm to some advantage. The useful upper limit for line width value is about 2000 μm; while the useful range for edge-to-edge spacing 40 is from about 50 μm to about 300 μm. Thus the parallel stripes of aluminum each form separate regions of dopant source material for the p-n junction solar cell, and, as explained further herein, are joined (contiguous) at their base to form a bus bar region for the positive contact bus bar.

In a preferred method for depositing aluminum it is deposited by screen printing the aluminum, a process known per se in the art, in an aluminum paste. The stripes of aluminum are shown in FIG. 2, where aluminum is deposited, as stripes 50, running into the plane of the paper. However, methods other than screen printing for depositing the aluminum are within the scope of the invention, such as electron beam evaporation or sputtering, although these methods may require more costly patterning by photolithography and so are less desirable.

Generally speaking, the Al layer of p-type material is relatively thin when compared to the n-type bulk layer, about 2 to 20 μm thick for a bulk layer with thickness of about 100 μm.

Note that in the preferred embodiment of the present invention the choice of aluminum serves at least three purposes simultaneously: it acts as a p-type dopant source, it acts as a positive contact metal, and it acts as a partial back surface light reflector over that back surface area it covers, which is approximately 50% of the back area.

Figure 3:
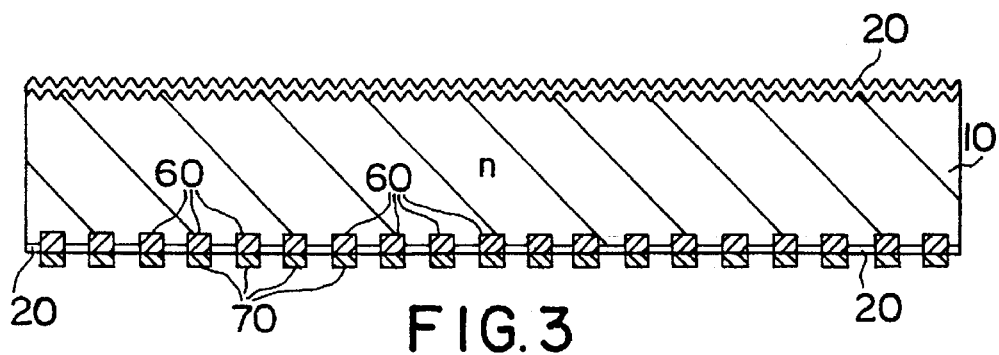
FIG. 3 illustrates the cross-section of the web at the heat treatment stage.

Turning attention now to FIG. 3, which illustrates heat treatment, there is shown a figure depicting the effects of heat treatment of the deposited Al layer in an approximately 850° C. oxygen-rich environment. In this step the p-n junction is formed by alloying the screen-print deposited Al with the Si. It is further believed that maintaining a temperature of 850° C. for an extended period of time, as for example 30 minutes or more, is beneficial to forming a satisfactory alloy. The range in temperatures can be from 577° C., the aluminum-silicon eutectic temperature, to 1420° C., the melting point of silicon. Heating may be provided by a rapid thermal processing unit, a belt furnace, a tube furnace, or other means. The ambient atmosphere can be inert, such as argon or nitrogen, or chemically active such as with oxygen or hydrogen. Mixtures of ambient gases are also possible. Times at elevated temperatures can range from 30 seconds to several hours. In the preferred embodiment it is expected that the use of an oxygen-rich environment at this temperature will enable oxide ($SiO_2$) to grow on any exposed Si, which will passivate the surface and decrease harmful recombination effects.

The temperature is then lowered in the Si—Al alloy, and Si regrows by liquid phase epitaxy until the eutectic temperature (577° C.) is reached. As a result, the regrown Si is now doped p-type with Al (about $10^{18}$ $cm^{-3}$), as denoted by the $p^+$ layer composition 60 in FIG. 3. The required p-n junction is formed as the Al concentration exceeds the donor concentration in the starting Si, and the eutectic alloy (about 88.7% Al and 11.3% Si, by weight) remains on the surface to serve as stripe contacts to the p-type silicon. It should be noted that the p-n junction may be quite deep (1 to 20 microns from the surface) but since the junction is at the back of the cell, where very little light is absorbed, the junction depth is only of secondary importance as compared to a conventional front contact solar cell. The depth of the alloy junction can be controlled by using an Al—Si mixture as the screen-printed material deposited instead of pure Al. This is because as the Si concentration is increased toward the eutectic composition, the amount of Si that the printed metal can dissolve becomes less, hence the junction depth becomes less. The junction depth can be increased, if desired, by increasing the thickness of the deposited aluminum and by increasing the alloying temperature, in accordance with the aluminum-silicon phase diagram.

Further, the bulk lifetime of minority carriers will probably increase at the approximately 850° C. temperature due to the property of dendritic web silicon (the preferred type of Si used in the present invention) to have any quenched-in defects, such as Si vacancies and self-interstitials, anneal out. Cooling at a controlled rate of 10° C. per minute versus a more rapid cooling will also allow quenched-in Si defects to anneal out, reducing harmful recombination sites.

The foregoing heat treatment may be effected using a belt furnace process in which the samples are loaded on a belt and the belt is slowly pulled through stable hot zones in a furnace. In the alternative to heating the Si/Al mixture at 850° C. for about 30 minutes in such a furnace, one may employ a variety of other techniques to form the Si/Al eutectic, such as the use of a rapid thermal processing unit that employs by way of example quartz lamps to heat the Si to 1000° C. and maintain that temperature for 30 seconds, which would increase throughput in a commercial setting, or by a conventional quartz tube furnace.

Having such a $p^+$ region (region 60 from FIG. 3) immediately adjacent to the $n^+$ region at the back surface layer (the back surface layer 20 from FIG. 1) also has the unanticipated benefit of protecting the solar cell from overheating when it is reverse biased, as for example by shadowing in a module. A "module" is a group of interconnected cells which are protected by glass or other cover material, and which produce a significant amount of power, typically 10 to 100 watts, when illuminated. This $p^+$ $n^+$ design builds in protection against reverse ++bias, eliminating any need to have protection diodes, commonly referred to as "bypass diodes" to guard against reverse bias. The $p^+$ $n^+$ junction acts as a Zener diode which breaks down under modest reverse biases with only a small voltage and consequently only a small amount of power is dissipated in the cell, thus protecting the cell.

Figure 4A:
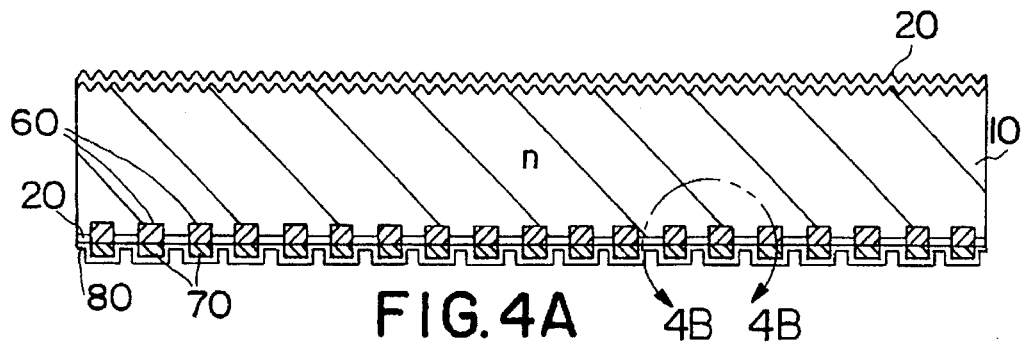
FIG. 4A illustrates the cross-section of the web during the insulation of the first metal stage to form aluminum oxide.
Figure 5A:
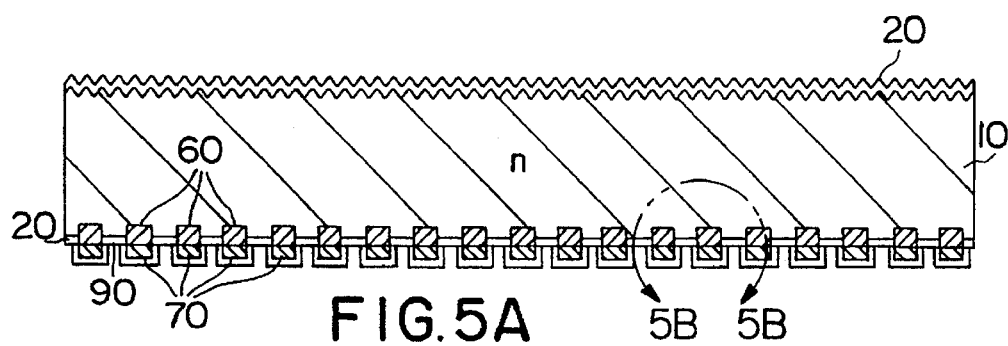
FIG. 5A illustrates the cross-section of the web during the removal of silicon oxide from the back surface.
Figure 4B:
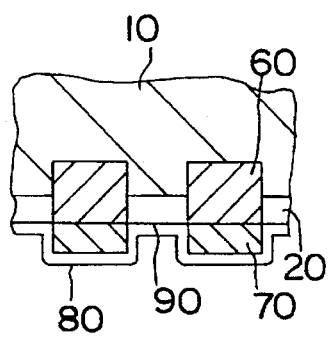
FIG. 4B illustrates a close-up view of the back surface portion of the web of FIG. 4A.
Figure 5B:
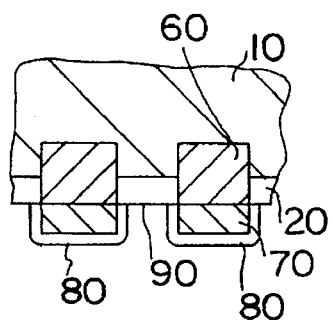
FIG. 5B illustrates a close-up view of the back surface of the web of FIG. 5A.

Turning attention now to FIGS. 4A and 4B, another step in the preferred embodiment of the present invention is illustrated. This step provides a unique "self-aligning" feature for aligning the negative contact (to the n-type region) with respect to the positive contact (to the p-type region). In order to insulate the p-type layer contact (positive contact)

from the n-type layer contact (negative contact), the present invention does not require complicated masking techniques that have been used in the past, but rather, employs the use of insulation by forming an oxidation layer to coat the first (positive) set of Al contacts and electrically isolate this set from the second (negative) set of contacts. As shown in FIGS. 4A and 4B, this is done by insulating the Al—Si $p^+$ layer composition and the exposed Al stripes 70 that are on the outside of the web blank 10, with an oxide layer 80 (insulator), which forms naturally on exposed Si, Si—Al and Al materials, in the form of $Al_2O_3$, $SiO_2$, or some variation thereof, in the presence of oxygen. The oxide layer should be grown to cover the Al stripes 70 to a thickness of approximately 0.1 µm to 1 µm. As shown in FIGS. 4A and 4B, at this stage the oxide layer 80 also covers the $n^+$-layer surface regions 90 in between the Al stripes 70. As described more fully below, the oxide layer on the surface regions 90 is subsequently removed (refer to the step illustrated in FIG. 5B below) in order to enable ohmic contact with the cathode (n-type Si) of the solar cell diode.

The preferred method of forming the oxidation layer in FIGS. 4A and 4B is by anodic oxidation, in which the layer surface of the developing cell is immersed in a weak electrolyte (such as borates, phosphates or carbonates) and subjected to an applied voltage. Current flows as a result of a voltage applied between an inert electrode and the contact metal (the Al—Si eutectic). The thickness of the anodic oxide can reach 1 micron if the voltage which drives the anodization current reaches 700 V (14 A/V or 1.4 nm/V). Such oxides should be compact and free from pinholes. Because ohmic contact must be made to a positive contact bus bar (at region 110, shown in FIG. 7) when the solar cell is finished in order to make contact with the exposed Al stripes 70, the growth of anodic oxide must be inhibited in the bus bar region (and this bus bar region must be shielded throughout the process). One way to do this is to use a compressive yet conductive medium to contact the area to be occupied by the bus bar, such as a carbon-impregnated closed-cell sponge. A closed-cell sponge is preferable as it will not absorb the electrolyte.

Besides anodic oxidation, any other method for insulating the aluminum or aluminum-silicon eutectic layer is also envisioned by the present invention, such as oxidizing aluminum in an oxygen-containing plasma.

After the oxidation layer 80 has been added by anodic oxidation or any other suitable method, the n-type Si surface covered by the oxidation layer in interstitial surface regions 90 must be exposed in order to permit the negative contact metal layer of Al to be deposited thereon. Thus, referring to FIGS. 5A and 5B, there is illustrated how the oxidation layer is removed from the Si layer on the back surface, but not the oxidation covering the Al stripes 70. In a preferred method of doing this, hydrofluoric acid is used to selectively etch away and remove the interstitial $SiO_2$ (silicon dioxide) 80 because hydrofluoric acid does not react and remove $Al_2O_3$ (aluminum oxide). Consequently, the interstitial $SiO_2$ is removed while the $Al_2O_3$ insulative layer remains covering the stripe contacts 70 (see FIG. 5B). Other chemicals having similar effects may be used, or other oxide removal techniques may be employed, such as by light sandblasting of the silicon dioxide layer, which also provides the beneficial effect of lightly damaging the exposed silicon surface, which promotes ohmic contact to the n-type base. Use of sandblasting eliminates the need for an $n^+$ diffused layer on the back of the cell, which is usually provided primarily to promote an ohmic contact. Reactive ion etching (RIE) may also be used to remove $SiO_2$ while leaving $Al_2O_3$ undisturbed. Ion milling may also be used to lightly damage the surface to promote ohmic contact in a manner analogous to sandblasting.

Figure 6A:
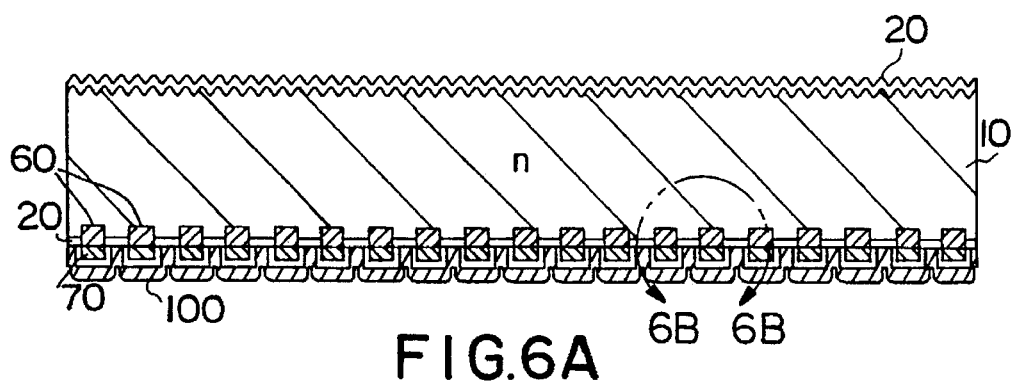
FIG. 6A illustrates the cross-section of the web during the deposition of metal for the negative contact.
Figure 6B:
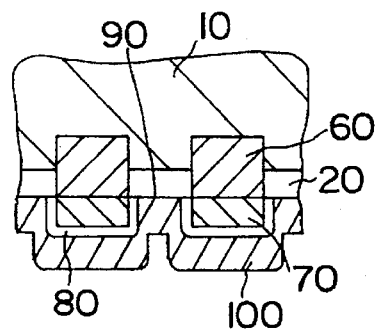
FIG. 6B illustrates a close-up view of the back surface of FIG. 6A.

FIGS. 6A and 6B illustrate the next step in the process of fabricating the solar cell of the present invention, viz. the application of a second metal layer to form the self-aligned negative ohmic contact metal (for the n-type Si layer contact). This second metal may be any suitable contact metal, including aluminum and silver. Again, screen printing is the preferred method for depositing this second metal, but other methods such as electron beam evaporation or sputtering are also acceptable. This second metal layer, designated as metal layer 100, covers nearly the entire back of the cell. This layer is insulated from the first metal contact stripes 70 by the anodic oxide 80 while making ohmic contact to the $n^+$ regions 90, found in between the metal stripes 70 formed from the first aluminum layer deposited. The second metal layer also helps form a back surface light reflector to aid in reflecting any light not absorbed by the silicon material in a first pass back into the silicon material.

Figure 7:
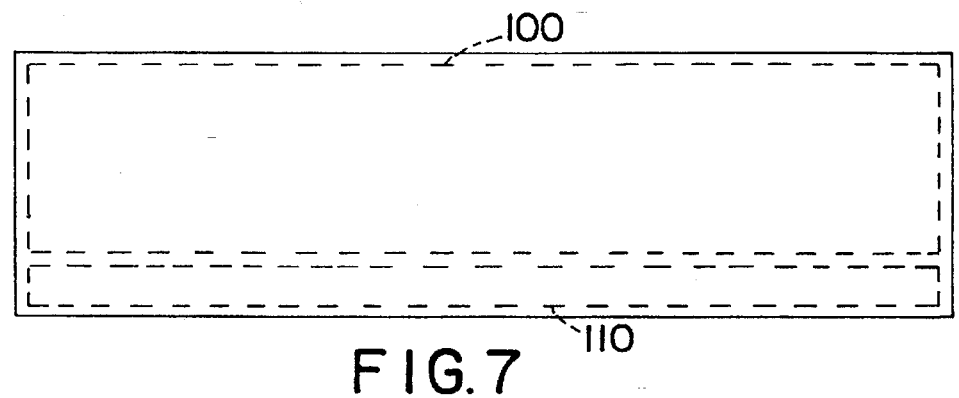
FIG. 7 is a bottom, back view of the finished cell.

FIG. 7 shows the completed solar cell as viewed from the back, where the cell is covered with the second metal (aluminum or other ohmic metal) or aluminum-silicon eutectic. The solar cell of the present invention has an unobstructed front surface, which is a significant advantage over conventional solar cells. At the back, both metal contacts (ohmic metal contacts 70 and 100) serve as partial light reflectors in addition to being ohmic contacts. Furthermore, the bus-bar design allows for the simplified interconnection of solar cells of the present design in series, as the present design eliminates the need for cumbersome external front-to-back inter-cell contacts to be manufactured, but uses more of a "surface-mount" technology design that dispenses with such contacts.

Thus referring to FIG. 7 there is shown bus bar region 110, which is the un-oxidized area where the bus bar contact leading to the first positive contact metal stripes 70 is located, as explained above. The bus bar region 110 as can be seen is smaller in area than the area covered by the negative contact metal, layer 100, but both the positive and negative metal contacts lend themselves nicely to a modular surface mount design. The Al—Si eutectic fingers 70 emanate vertically upwardly from the bus bar 110 of FIG. 7 but are not visible in the figure due to the overlying second metal layer 100.

If desired, other ohmic contact metals than Al or Ag may be deposited to form the positive and negative ohmic contacts described herein, such as by way of example using a titanium/palladium/copper sandwich or screen-printed silver as contacts.

Regarding the use of anti-reflective (AR) coatings, a coating layer or layers would ordinarily appear on the outermost front illuminated surface, but they have been omitted from FIGS. 1–7 for clarity. It is possible that an AR coating is optional with the present design, since texturing, or perhaps texturing in combination with a passivating oxide, as explained above, may be sufficiently effective so as to preclude the need for an AR coating. However, an AR coating such as silicon nitride applied by plasma-enhanced chemical vapor deposition (PECVD) or titanium dioxide applied by atmospheric pressure chemical vapor deposition (APCVD) can be used. Hydrogen ion implantation (to improve minority carrier diffusion length) could also be introduced prior to an AR coating deposition, provided the surface oxide was absent or perhaps very thin.

REDUCTION TO PRACTICE

Figure 8:
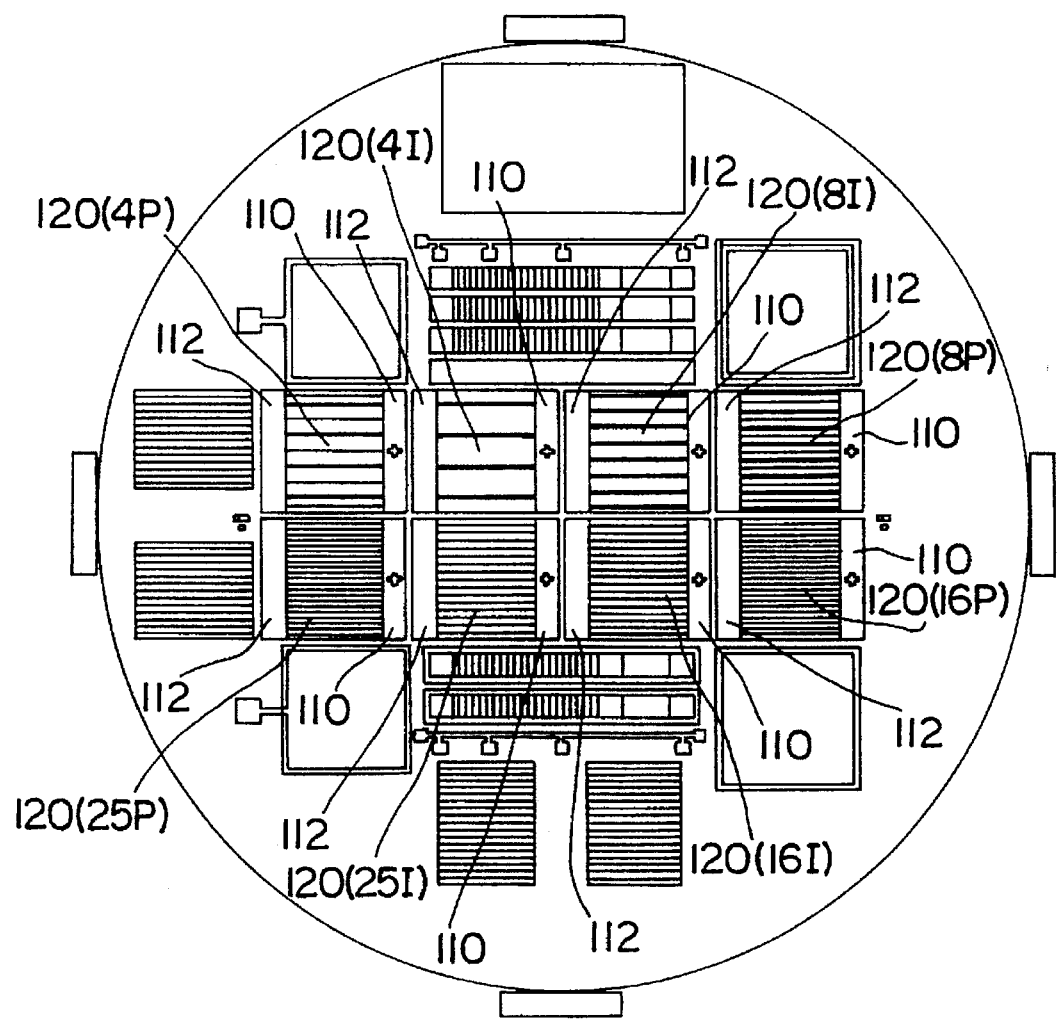
FIG. 8 is a plan view of the back side surface of a substrate having 8 cells.

With reference to FIG. 8, complete aluminum alloy junction interdigitated back contact (IBC) solar cells 120 were fabricated using Czochralski silicon wafers as starting substrates. These solar cells serve to demonstrate the use of aluminum alloy junctions in a back contact configuration. The aluminum was deposited by electron beam evaporation, rather than by screen printing. The negative electrodes were not self-aligned using anodic oxidation or some other technique, but rather were manually aligned with respect to the aluminum-silicon eutectic positive electrodes with the aid of a contact aligner as used for fabricating integrated circuits.

The silicon substrate wafers were single-side polished, 3 inches in diameter, 13–17 mils thick, phosphorus-doped to 3–20 Ω-cm, and with a (111) surface. Two wafers (designated CZ-7 and CZ-8) were processed with test structures and solar cells on the polished side. FIG. 8 shows the back side of one such wafer. The lapped side (hidden from view in FIG. 8) has a phosphorus diffusion and an antireflective (AR) coating 95 (see FIGS. 10 and 12). Each of the eight solar cells is 1.00 cm square, ignoring the 2 mm wide bus bar 112 for the negative electrodes. They are referenced below in Tables 2 and 3 by the number of $n^+$ fingers forming the negative contact (4, 8, 16 and 25) and by their location (interior (I) or peripheral (P)). The four interior cells have only the eutectic alloy contacting the $p^+$ region, while the peripheral cells have the second metal also deposited on the eutectic. Better results were obtained for wafer CZ-8, so only the process and test results for this wafer will be described.

Figure 9:
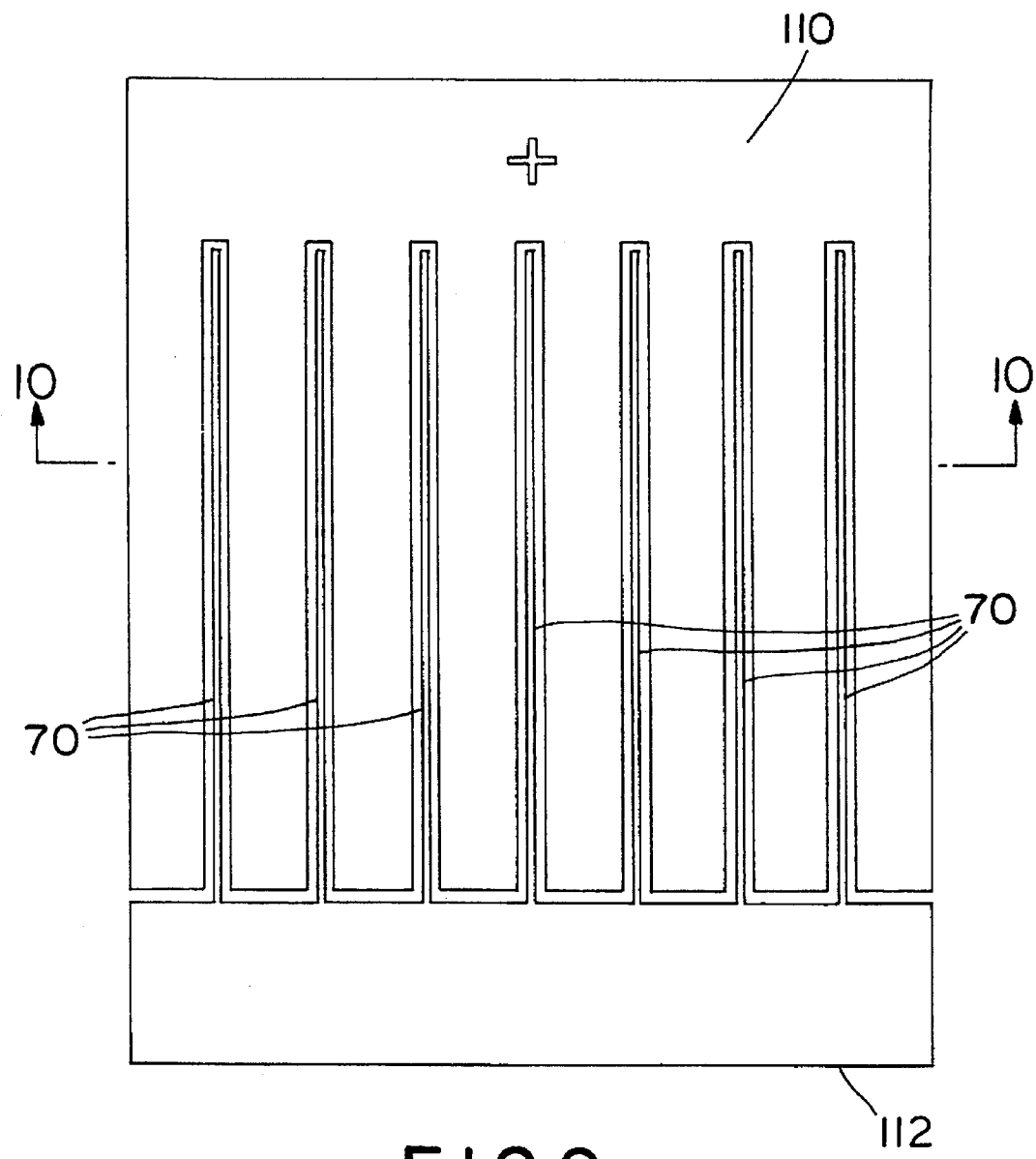
FIG. 9 is an enlarged view of the rear surface of one of the cells on the substrate of FIG. 8.
Figure 10:
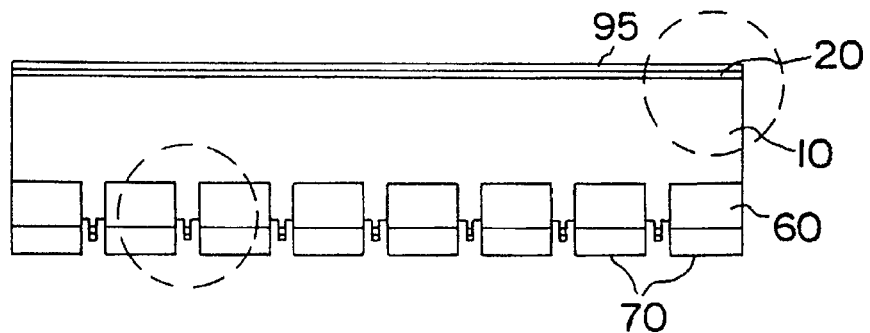
FIG. 10 is a sectional view taken along lines 10—10 of FIG. 9.
Figure 11:
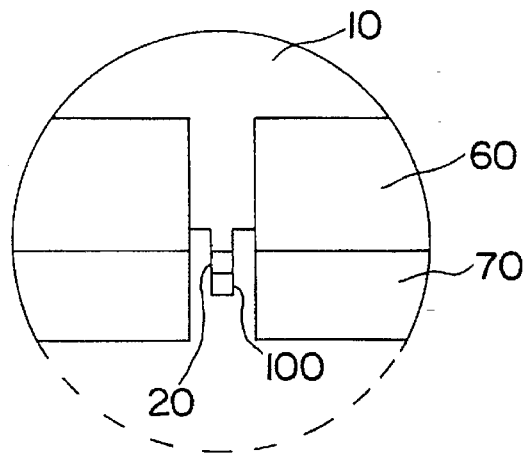
FIG. 11 is an enlarged detail view illustrating a portion of a pair of positive electrodes and the region therebetween.
Figure 12:
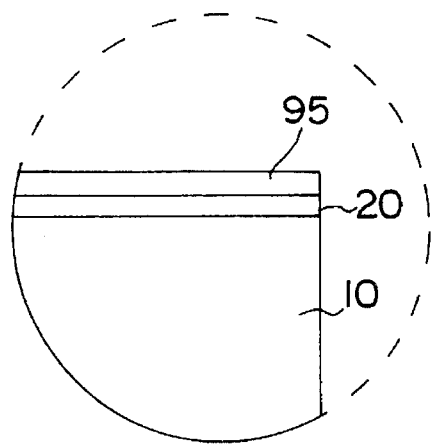
FIG. 12 is an enlarged detail view illustrating a corner portion of the top of the FIG. 9 cell.

The process used in fabricating the IBC cells for wafer CZ-8 is summarized in the table below. A noteworthy feature of this process is that the back aluminum alloy junction and the phosphorus-doped $n^+$ layers, formed across the front surface and at the exposed back surface between aluminum electrodes, were created in a single high-temperature step. Photolithography was employed to pattern the evaporated aluminum and to define the second metal which serves as the negative electrode. A back side view of the aluminum alloy junction IBC solar cell is shown in FIG. 9, while cross-sectional views are shown in FIGS. 10–12.

TABLE 1

Process For Wafer CZ-8

| Step | Description | Material | Thickness | Process |
|---|---|---|---|---|
| 1 | Deposit Aluminum (polished side) | Al | 3 μm | Evaporate |
| 2 | Define pattern (mask 1) | AZ 1350J | 1.5 μm | Spray, belt bake |
| 3 | Remove aluminum | Al | 3 μm | Aluminum etch |
| 4 | Apply phosphorus liquid dopant front and back (over aluminum) | P-507 | 0.3 μm | Paint liquid dopant |
| 5 | Create $p^+$ regions (alloy) on back and $n^+$ regions front and back | Al P-507 | 3 μm 0.3 μm | RTP(1000° C., 30 sec) |
| 6 | Define pattern (mask 3) | AZ 1350J | 1.5 μm | Spin, hot plate bake |
| 7 | Deposit metal (polished side) | Ti/Al | 500 Å/0.5 μm | Evaporate |
| 8 | Define contact | n/a | n/a | Lift-off |
| 9 | Protect front diffusion | wax | undefined | Melt using hot plate |
| 10 | Etch silicon between electrodes | $n^+$ silicon | 1.5 μm | 50:1 HNO$_3$:HF, 2 min |
| 11 | Apply antireflective coating | TiO$_2$ | 750 Å | Spin (2500 rpm, 30 sec) |
| 12 | Fire antireflective coating | TiO$_2$ | 750 Å | 450° C., air |

Some comments regarding the CZ-8 process:

Alloy/$n^+$ diffusion process includes a stepped slow-cool in the rapid thermal processing (RTP) unit (≈50° C./min from 1000° C. to 825° C.);

There was no apparent harm in painting liquid phosphorus dopant over the aluminum before the 1000° C. RTP process which simultaneously formed the $p^+$ and $n^+$ regions;

Depth of $p^+$ region determined to be 5 μm by cross-sectional scanning electron microscopy for 1000° C., 30 sec RTP process;

Sheet resistance of front $n^+$ surface measured 25 Ω/□ after 1000° C., 30 sec RTP diffusion;

Mask 2 was skipped because it was only needed for some test patterns, not for the IBC cells;

The Ti/Al contact to $n^+$ surface is limited to a thickness of 0.55 μm by the lift-off process;

Without etching $n^+$ silicon between positive electrode (eutectic) and negative electrode (Ti/Al), the p-n junction was severely shunted.

TABLE 2

Lighted (AM1.5, 100 mW/cm$^2$, front illumination) I-V Data Before AR Coating

| Wafer | Cell | $J_{sc}$ (mA/cm$^2$) | $V_{oc}$ (V) | Fill Factor | Efficiency (%) |
|---|---|---|---|---|---|
| CZ-8 | 4I | 22.4 | 0.516 | 0.611 | 7.07 |
| CZ-8 | 8I | 19.9 | 0.522 | 0.621 | 6.45 |
| CZ-8 | 16I | 19.6 | 0.518 | 0.581 | 5.90 |
| CZ-8 | 25I | 20.6 | 0.510 | 0.580 | 6.08 |

TABLE 3

Lighted (AM1.5, 100 mW/cm$^2$, front illumination) I-V Data After AR Coating

| Wafer | Cell | $J_{sc}$ (mA/cm$^2$) | $V_{oc}$ (V) | Fill Factor | Efficiency (%) |
|---|---|---|---|---|---|
| CZ-8 | 4I | 27.6 | 0.515 | 0.635 | 9.01 |
| CZ-8 | 8I | 24.2 | 0.515 | 0.691 | 8.61 |
| CZ-8 | 16I | 23.6 | 0.510 | 0.695 | 8.35 |
| CZ-8 | 25I | 23.5 | 0.505 | 0.716 | 8.50 |

Note that functioning back contact solar cells were obtained, thereby demonstrating the viability of the disclosed structure. Light-to-electrical energy conversion efficiencies up to 9.0% have been measured. Refinements in substrate material and processing techniques are expected to raise the efficiency to double that demonstrated to date.

While the above provides a full and complete disclosure of the preferred embodiment of the invention, various modification, alternate constructions and equivalents may be employed. For example, while the preferred embodiment has been described with reference to aluminum for forming the p-type diffusion and the ohmic contacts, other group III metals such as gallium and indium may be employed for this purpose. A suitable group III element is one which will dissolve the silicon and remain behind as a trace amount to serve as a dopant when the silicon solidifies. In addition, while the preferred embodiment has been described with reference to an n-type bulk silicon layer 10, p-type bulk silicon may be used to fabricate the back-contact solar cell. When a p-type bulk silicon layer is used, a thin $p^+$ layer is formed on the top surface as layer 20, but an $n^+$ layer is formed on the bottom of the bulk layer 10. As will be appreciated by those skilled in the art, in the p-type embodiment, the minority carriers are electrons. Therefore, the above description and illustrations should not be construed as limiting the scope of the invention, which is defined by the appended claims.

What is claimed is:

1. A back-contact solar cell comprising:
   a semiconductor bulk layer of a first conductivity type having a front surface and a back surface;
   a plurality of spaced doped semiconductor regions of opposite conductivity type formed in said bulk layer near said back surface and forming a plurality of semiconductor junctions therewith;
   said front surface being entirely of said first conductivity type;
   a first set of spaced ohmic contacts connected to said plurality of spaced doped semiconductor regions and located along said back surface, said first set of spaced ohmic contacts comprising an alloy of said bulk layer semiconductor material and a Group III metal comprising the acceptor dopant for said plurality of spaced doped semiconductor regions;
   a second set of ohmic contacts connected to said back surface of said bulk layer in the spaces between said first set of ohmic contacts; and
   insulator means for electrically isolating said first set of spaced ohmic contacts from said second set of ohmic contacts.

2. The solar cell according to claim 1, wherein said first set of ohmic contacts is in the form of substantially mutually parallel conductive stripes.

3. The solar cell according to claim 2, wherein said conductive stripes are joined at one end to form a bus bar contact.

4. The solar cell according to claim 1, wherein said semiconductor bulk layer has a thickness no greater than the diffusion length of the minority carriers of said first conductivity type.

5. The solar cell according to claim 1, wherein said bulk layer is formed of n-type silicon.

6. The solar cell according to claim 5 wherein said n-type silicon is dendritic web silicon.

7. The solar cell according to claim 1 wherein said Group III metal is selected from the group consisting of aluminum, gallium, and indium.

8. The solar cell according to claim 1 wherein said insulator means comprises an insulative layer covering said first set of ohmic contacts.

9. The solar cell according to claim 1, further including an anti-reflective coating on said front surface.

10. The solar cell according to claim 1, wherein said bulk layer is formed of n-type material, and said front and back surfaces are initially doped $n^+$.

11. The solar cell according to claim 1 wherein said second set of ohmic contacts is comprised of an ohmic metal selected from the group consisting of silver, aluminum, copper, titanium, and palladium.

12. The solar cell according to claim 1 wherein at least one of said front and back surfaces is textured to increase light trapping in said bulk layer.

13. A method of manufacturing a back-contact solar cell with self-aligning ohmic contacts, said method comprising the steps of:
   (a) providing a semiconductor bulk layer of a first conductivity type, said bulk layer having a front surface entirely of said first conductivity type and a back surface;
   (b) forming a plurality of semiconductor doped regions of opposite conductivity type in said bulk layer near said back surface only;
   (c) forming a first set of spaced ohmic contacts for said doped regions on said back surface using an ohmic contact metal material, said steps (b) and (c) being concurrently performed by applying a patterned layer containing a Group III metal to the back surface of said bulk layer, heating at least the back surface and adjacent interior regions of said bulk layer so that the bulk layer material in said interior regions and said patterned layer form an alloy, and allowing the alloy to cool so that said doped regions are formed using the Group III metal as an acceptor and the first set of contacts is formed from the cooled alloy remaining at the back surface;
   (d) electrically insulating said first set of ohmic contacts from the spaces therebetween; and
   (e) forming a second set of ohmic contacts on said back surface in said spaces using an ohmic contact metal material, said second set of ohmic contacts being electrically insulated from said first set of ohmic contacts.

14. The method of manufacturing a back contact solar cell according to claim 13 wherein said step (a) of providing is performed with n-type silicon.

15. The method of manufacturing a back contact solar cell according to claim 13 wherein said step (a) of providing is performed with n-type silicon having an $n^+$ surface diffusion layer on the front surface thereof.

16. The method of manufacturing a back contact solar cell according to claim 13 wherein said step (a) of providing is performed with n-type silicon having an $n^+$ surface diffusion layer on the front and back surfaces thereof.

17. The method of manufacturing a back contact solar cell according to claim 13 wherein said steps (b) and (c) are concurrently performed.

18. The method of manufacturing a back contact solar cell according to claim 13 wherein said patterned layer comprises a mixture of Group III metal and the bulk layer material.

19. The method of manufacturing a back contact solar cell according to claim 18 wherein said mixture comprises aluminum and silicon.

20. The method of manufacturing a back contact solar cell according to claim 13 wherein said patterned layer comprises a plurality of individual stripes.

21. The method of manufacturing a back contact solar cell according to claim 20 wherein said stripes are substantially mutually parallel.

22. The method of manufacturing a back contact solar cell according to claim 13 wherein said patterned layer is applied by screen printing.

23. The method of manufacturing a back contact solar cell according to claim 13 wherein said step (d) of electrically insulating is performed by forming an insulative layer over said first set of ohmic contacts and spaces therebetween, and selectively removing portions of said insulative layer overlying said spaces from said back surface of said bulk layer, so that said insulative layer covers substantially only said first set of ohmic contacts and the spaces are exposed.

24. The method of manufacturing a back contact solar cell according to claim 23 wherein said step of selectively removing comprises the step of etching the portions of said insulative layer overlying said spaces.

25. The method of manufacturing a back contact solar cell according to claim 24 wherein said step of etching is chemical.

26. The method of manufacturing a back contact solar cell according to claim 24 wherein said step of etching is reactive ion etching.

27. The method of manufacturing a back contact solar cell according to claim 23 wherein said step of selectively removing comprises the step of sandblasting the portions of said insulative layer overlying said spaces.

28. The method of manufacturing a back contact solar cell according to claim 23 wherein said step of selectively removing comprises the step of ion milling the portions of said insulative layer overlying said spaces.

29. The method of manufacturing a back contact solar cell according to claim 13, further comprising the steps of texturing at least one of said front and back surfaces of said bulk layer.

30. The method of manufacturing a back contact cell according to claim 13 further comprising the step of applying an anti-reflective coating on said front surface.

* * * * *